United States Patent
Shanbhag et al.

(10) Patent No.: US 11,859,282 B2
(45) Date of Patent: Jan. 2, 2024

(54) MANIFOLD VALVE FOR CONTROLLING MULTIPLE GASES

(71) Applicant: Lam Research Corporation, Fremont, CA (US)

(72) Inventors: Damodar Rajaram Shanbhag, Beaverton, OR (US); Nagraj Shankar, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/874,188

(22) Filed: Jul. 26, 2022

(65) Prior Publication Data

US 2022/0372619 A1 Nov. 24, 2022

Related U.S. Application Data

(63) Continuation of application No. 16/966,831, filed as application No. PCT/US2019/015799 on Jan. 30, 2019, now Pat. No. 11,427,908.

(Continued)

(51) Int. Cl.
*H01J 37/32* (2006.01)
*C23C 16/455* (2006.01)
(Continued)

(52) U.S. Cl.
CPC .......... *C23C 16/455* (2013.01); *C23C 16/52* (2013.01); *F16K 27/003* (2013.01); *H01J 37/3244* (2013.01); *H01J 37/32431* (2013.01)

(58) Field of Classification Search
CPC ........ F16K 27/003; F16K 19/00; F16K 11/22; F16K 51/02; F16K 27/0263; F16K 27/00;
(Continued)

(56) References Cited

U.S. PATENT DOCUMENTS 6,502,601 B2 * 1/2003 Eidsmore ............ F15B 13/0814
  137/884
7,153,542 B2 12/2006 Nguyen et al.
(Continued)

FOREIGN PATENT DOCUMENTS

CN  101496144 A  7/2009
CN  106661730 A  5/2017
(Continued)

OTHER PUBLICATIONS

U.S. Appl. No. 16/966,831, Non Final Office Action dated Dec. 13, 2021, 17 pgs.
(Continued)

*Primary Examiner* — Rudy Zervigon
(74) *Attorney, Agent, or Firm* — Schwegman Lundberg & Woessner, P.A.

(57) ABSTRACT

Various embodiments include an apparatus to supply gases to a tool. In various examples, the apparatus includes a point-of-use (POU) valve manifold that includes a manifold body to couple to a chamber of the tool. The manifold body has multiple gas outlet ports. A purge-gas outlet port of the manifold body is directed substantially toward the outlet ports. For each of multiple gases to be input to the POU-valve manifold, the POU-valve manifold further includes: a first valve coupled to the manifold body and a divert valve coupled to the first valve. The first valve can be coupled to a gas supply and has a separate gas flow path internal to the manifold body and separate from remaining ones of the gas flow paths. The divert valve diverts the gas during a period when the precursor gas is not to be directed into the chamber by the first valve. Other examples are disclosed.

16 Claims, 4 Drawing Sheets

Related U.S. Application Data

(60) Provisional application No. 62/624,710, filed on Jan. 31, 2018.

(51) Int. Cl.
  *C23C 16/52* (2006.01)
  *F16K 27/00* (2006.01)

(58) Field of Classification Search
  CPC .............. F15B 13/0892; F15B 13/0814; F15B 13/0871; F15B 13/0896; F15B 13/0839; F15B 13/0807; F15B 13/0832; F15B 2013/004; F15B 2013/006; F15B 13/0817; F15B 13/0825; C23C 16/455; C23C 16/52; C23C 16/45544; C23C 16/45563; H01J 37/32431; H01J 37/3244
  USPC ......................... 118/715; 156/345.33, 345.34
  See application file for complete search history.

(56) References Cited

U.S. PATENT DOCUMENTS

| | | | |
|---|---|---|---|
| 9,574,268 | B1 | 2/2017 | Dunn et al. |
| 11,427,908 | B2 | 8/2022 | Shanbhag et al. |
| 2003/0172872 | A1 | 9/2003 | Thakur et al. |
| 2005/0208217 | A1 | 9/2005 | Shinriki et al. |
| 2008/0202588 | A1 | 8/2008 | Gold et al. |
| 2008/0276860 | A1 | 11/2008 | Burrows et al. |
| 2010/0050942 | A1 | 3/2010 | Kato et al. |
| 2012/0006436 | A1* | 1/2012 | Morimoto ............. F16K 11/085 137/625 |
| 2013/0333768 | A1 | 12/2013 | Chandrasekharan et al. |
| 2015/0267299 | A1 | 9/2015 | Hawkins et al. |
| 2016/0017493 | A1 | 1/2016 | Dhas et al. |
| 2016/0177443 | A1 | 6/2016 | Kumar et al. |
| 2016/0281223 | A1 | 9/2016 | Sowa et al. |
| 2017/0021317 | A1* | 1/2017 | Shareef ................. B01F 33/841 |
| 2017/0121818 | A1 | 5/2017 | Dunn et al. |
| 2017/0183773 | A1* | 6/2017 | Okura ............... C23C 16/45527 |
| 2017/0350011 | A1 | 12/2017 | Marquardt |
| 2021/0040611 | A1 | 2/2021 | Shanbhag et al. |

FOREIGN PATENT DOCUMENTS

| | | |
|---|---|---|
| CN | 107447204 A | 12/2017 |
| CN | 111670265 A | 9/2020 |
| EP | 2586890 A1 | 5/2013 |
| GB | 0520448 | 11/2005 |
| WO | WO-2019152486 A1 | 8/2019 |

OTHER PUBLICATIONS

U.S. Appl. No. 16/966,831, Notice of Allowance dated Apr. 22, 2022, 8 pgs.
U.S. Appl. No. 16/966,831, Response filed Mar. 14, 2022 to Non Final Office Action dated Dec. 13, 2021, 16 pgs.
U.S. Appl. No. 16/966,931, Preliminary Amendment filed Aug. 20, 2020, 9 pgs.
Chinese Application Serial No. 201980011102.4, Office Action dated Jul. 1, 2022, with machine translation in English, 26 pgs.
International Application Serial No. PCT/US2019/015799, International Preliminary Report on Patentability dated Aug. 13, 2020, 8 pgs.
International Application Serial No. PCT/US2019/015799, International Search Report dated May 13, 2019, 3 pgs.
International Application Serial No. PCT/US2019/015799, Written Opinion dated May 13, 2019, 3 pgs.
"U.S. Appl. No. 16/966,831, Corrected Notice of Allowability dated Jul. 27, 2022", 5 pgs.
Chinese Application Serial No. 201980011102.4, Decision of Rejection dated May 17, 2023, w/ Machine English Translation, 16 pgs.
Chinese Application Serial No. 201980011102.4, Office Action dated Jan. 12, 2023, w/ Machine English Translation, 18 pgs.
Chinese Application Serial No. 201980011102.4, Response filed Mar. 27, 2023 to Office Action dated Jan. 12, 2023, w/ English claims, 6 pgs.
Chinese Application Serial No. 201980011102.4, Response filed Nov. 16, 2022 to Office Action dated Jul. 1, 2022, w/ English claims, 6 pgs.
Taiwanese Application Serial No. 108103769, Office Action dated Apr. 10, 2023, w/ English Translation, 16 pgs.
Taiwanese Application Serial No. 108103769, Response filed Jul. 7, 2023 to Office Action dated Apr. 10, 2023, w/ English claims, 19 pgs.

* cited by examiner

MANIFOLD VALVE FOR CONTROLLING MULTIPLE GASES

CLAIM OF PRIORITY

This application is a continuation of and claims the benefit of priority under 35 U.S.C. § 120 to U.S. patent application Ser. No. 16/966,831, filed on 31 Jul. 2020, which is a U.S. National-Phase Filing under 35 U.S.C. § 371 from International Application No. PCT/US2019/015799, filed on 30 Jan. 2019, and published as WO 2019/152486 A1 on 8 Aug. 2019, which claims the benefit of priority to U.S. Provisional Patent Application Ser. No. 62/624,710, filed on 31 Jan. 2018, and entitled, "Manifold Valve for Multiple Precursors," each of which is incorporated by reference herein in its entirety.

TECHNICAL FIELD

The subject matter disclosed herein relates to a point-of-use (POU) valve manifold and associated valves to control precursor gases in atomic layer deposition processing systems.

BACKGROUND

An atomic layer deposition (ALD) tool is a specialized type of chemical vapor deposition (CVD) processing system in which ALD reactions occur between two or more chemical species. The two or more-chemical species are referred to as precursor gases and are used to form a thin film deposition of a material on a substrate, such as a silicon wafer as used in the semiconductor industry. The precursor gases are sequentially introduced into an ALD processing chamber and react with a surface of the substrate to form a deposition layer upon combining. Generally, the substrate repeatedly interacts with the precursors to deposit slowly an increasingly thick layer of one or more material films on the substrate. In certain applications, multiple precursor gases may be used to form various types of film or films during a substrate manufacturing process. However, to prevent premature deposition, for example, within valves used to regulate flow of the precursor gases into a processing chamber within the processing system or gas lines connected to the valves, the precursor gases must be kept separated from each other to prevent particulate materials from forming. Currently, a single valve is often used to control multiple precursor gases. Without elaborate schemes to purge the valves and connected gas lines downstream of the valve, particulate matters can form that can, for example, clog the valves and prevent operation (e.g., opening and closing) of the valves.

The information described in this section is given to provide the skilled artisan a context for the following disclosed subject matter and should not be considered as admitted prior art.

DETAILED DESCRIPTION

Figure 1:
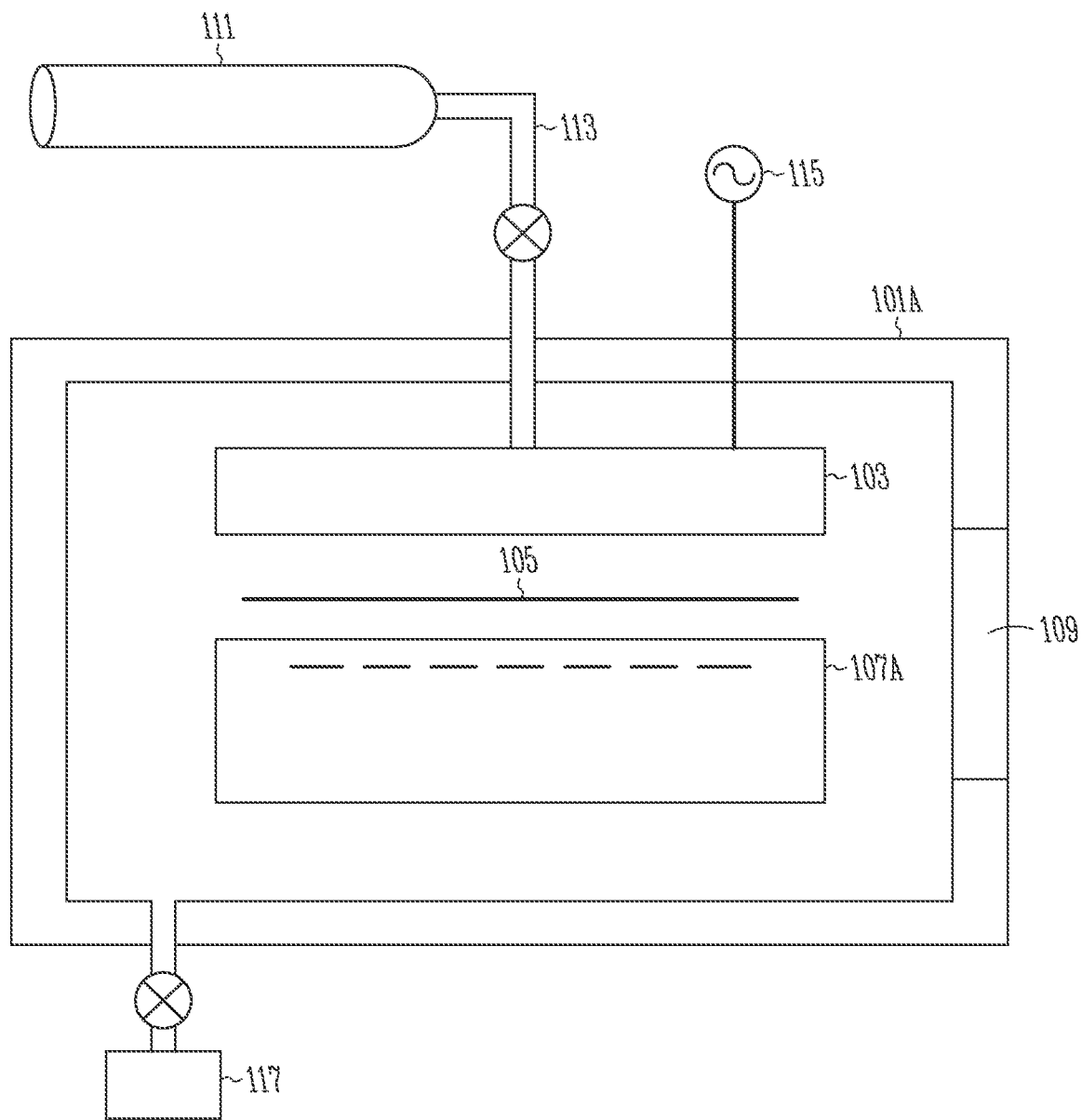
FIG. 1 shows a simplified example of a plasma-based processing chamber, which can include a substrate support assembly comprising an electrostatic chuck (ESC), for supporting a substrate during plasma processing, and a showerhead electrode.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well known process steps or structures have not been described in detail so as not to obscure the disclosed subject matter.

The disclosed subject matter contained herein describes a point-of-use (POU) valve manifold (including associated valves) that allows for multiple precursor gases to be delivered to a semiconductor processing chamber through a common outlet of the POU-valve manifold. The POU-valve manifold may have a plurality of precursor gas inlets, each controlled by at least one valve, and a purge gas inlet. Each precursor uses at least one dedicated POU valve and has a dedicated flow path separate from flow paths for other precursor gases, thereby reducing or eliminating the possibility for any precursor gases to be mixed within flow paths within the manifold.

As described in more detail below, the POU-valve manifold can deliver multiple precursor gases, with the precursor gases meeting only at a common outlet of the manifold. With a zero dead-leg (e.g., no dead-space volumes within the POU-valve manifold) and on-board mounting of any number of POU valves, the POU-valve manifold provides efficient precursor delivery, with a potential for one or more on-board heating elements, thereby eliminating any mixing reaction of precursor gases within the POU valves, flow paths within the manifold, or the manifold itself.

The POU-valve manifold described herein further provides efficient dosing of the various precursor gases. Additionally, the POU-valve manifold can be retrofit readily on any existing ALD tool or other type of processing tool. The precursor gases are each controlled by separate POU valves (also known to a skilled artisan as an ALD valve) and provide ample time for efficient dosing of the precursor gases.

As noted above, contemporaneous off-the-shelf manifolds for precursor gases, or even manifolds that are proprietary for a given equipment manufacturer, use only one, single valve that is common for all precursor gases. The single valve switches between the multiple precursor gases. Even with intermediate purging of the valve (which reduces efficiency of the valve since critical timing for the precursor gases cannot be met due to necessary purge cycles), using a single valve necessarily leads to mixing of the precursor gases. Deposits (formed from the precursor gases mixing) typically form at an internal body of the valve. The deposits can make the valve inoperable (e.g., the valve is unable to fully open and/or fully close) when the precursor gases mix and react within the internal volume of the valve. The degradation of these valves leads to frequent replacement of the valve, thereby leading to an increase in cost of ownership (COO) and resulting in tool down-time to replace the valves. Additionally, particle contamination caused by the reaction between the precursor gases in a common delivery path (e.g., through the same valve and tubing connections upstream and downstream of the valve) can also adversely affect deposition quality on the substrate.

The disclosed subject matter is a POU-valve manifold that has separate delivery paths for precursor gases flowing through the manifold. In one embodiment, two separate valves for each precursor gas mount on a custom valve block, described in detail below, which allows independent switching between the precursor gases. The manifold of the disclosed subject matter also allows independent switching of precursor gases between divert paths and flow paths to the processing chamber. Any dead legs are eliminated by using the disclosed POU-valve manifold. Additionally, the POU-valve manifold can have active heating with increased heat transfer and better control.

The POU-valve manifold is described herein for controlling two precursor gases for ease in understanding the inventive subject matter. However, the person of ordinary skill in the art, upon reading and understanding the descriptions provided herein, will understand readily how to expand the POU-valve manifold for any number of precursor gases. For example, the disclosed POU-valve manifold can readily incorporate four or more precursor gases.

With reference now to FIG. 1, a simplified example of a plasma-based processing chamber is shown. The plasma-based processing chamber may be used for plasma-enhanced or radical-enhanced ALD operations as is known in the art. The skilled artisan will also recognize that other types of ALD processing techniques are known (e.g., thermal-based ALD operations) and may incorporate a non-plasma-based processing chamber.

FIG. 1 is shown to include a plasma-based processing chamber 101A in which a showerhead 103 (which may be a showerhead electrode) and a substrate-support assembly 107A are disposed. Typically, the substrate-support assembly 107A provides a substantially-isothermal surface and may serve as both a heating element and a heat sink for a substrate 105. The substrate-support assembly 107A may comprise an ESC in which heating elements are included to aid in processing the substrate 105, as described above. As understood by a person of ordinary skill in the art, the substrate 105 may a wafer comprising elemental semiconductors (e.g., silicon or germanium), a wafer comprising compound elements (e.g., gallium arsenide (GaAs) or gallium nitride (GaN)), or variety of other substrate types known in the art (including conductive, semiconductive, and non-conductive substrates).

In operation, the substrate 105 is loaded through a loading port 109 onto the substrate-support assembly 107A. A gas line 113 supplies one or more process gases (e.g., precursor gases) to the showerhead 103. In turn, the showerhead 103 delivers the one or more process gases into the plasma-based processing chamber 101A. A gas source 111 (e.g., one or more precursor gas ampules) to supply the one or more process gases is coupled to the gas line 113. An RF power source 115 is coupled to the showerhead 103.

Prior to entry into the showerhead 103 and downstream of the gas line 113, a POU and manifold combination (not shown but known in the art) controls entry of the one or more process gases into the plasma-based processing chamber 101A. As noted above, in the case of a plasma-based processing chamber 101A used to deposit thin films in a plasma-enhanced ALD (PEALD) operation, precursor gases may be mixed in the showerhead 103. However, the POU and manifold combination disclosed herein in more detail with reference to FIGS. 2A through 2C below, may be used to deliver the precursor gases directly into the plasma-based processing chamber 101A or other type of processing chamber (e.g., a thermal processing chamber) known in the art.

In operation, the plasma-based processing chamber 101A is evacuated by a vacuum pump 117. RF power is capacitively coupled between the showerhead 103 and a lower electrode (not shown explicitly) contained within or on the substrate-support assembly 107A. The substrate-support assembly 107A is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. However, upon reading and understanding the disclosure provided herein, the person of ordinary skill in the art will recognize that a coil required to block or partially block a particular RF frequency can be designed as needed. Therefore, particular frequencies discussed herein are provided merely for ease in understanding. The RF power is used to energize the one or more process gases into a plasma in the space between the substrate 105 and the showerhead 103. As is known in the relevant art, the plasma can assist in depositing various layers (not shown) on the substrate 105. In other applications, the plasma can be used to etch device features into the various layers on the substrate 105. As noted above, the substrate-support assembly 107A may have heaters (not shown) incorporated therein. The person of ordinary skill in the art will recognize that, while the detailed design of the plasma-based processing chamber 101A may vary, RF power is coupled through at least the substrate-support assembly 107A.

Figure 2A:
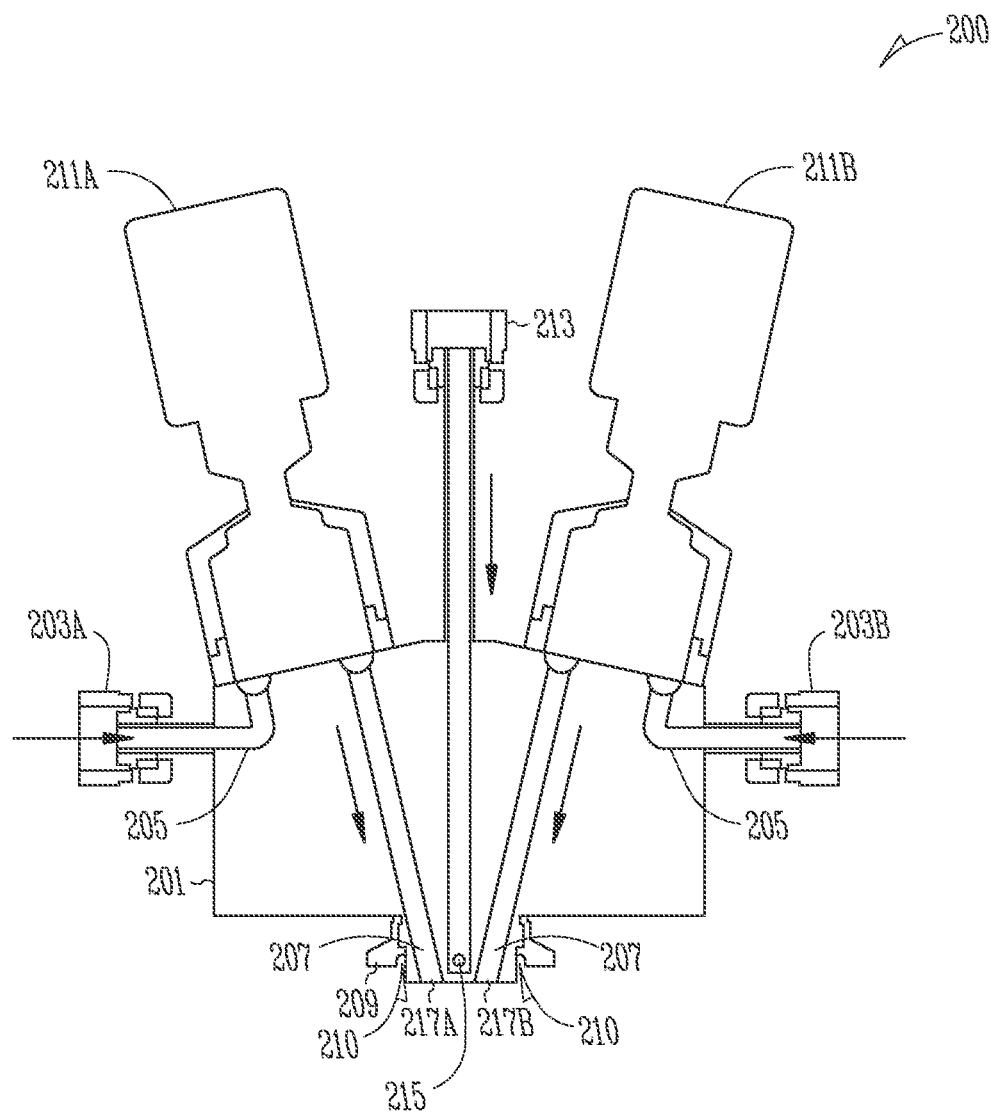
FIG. 2A shows a cross-sectional view of an example of a point-of-use (POU) valve and manifold combination in accordance with various embodiments of the disclosed subject matter.

Referring now to FIG. 2A, a cross-sectional view of an example of a point-of-use (POU) valve and manifold combination 200 in accordance with various embodiments of the disclosed subject matter is shown. FIG. 2A is shown to include a manifold block 201 onto which two valves are coupled. A first POU valve 211A is coupled to a first inlet flow path 205 (left side of FIG. 2A) from a first connector 203A, and a first outlet flow path 207 on the left side of FIG. 2A. A second POU valve 211B is coupled to a second inlet flow path 205 (right side of FIG. 2A) from a second connector 203B, and a second outlet flow path 207 on the right side of FIG. 2A. Arrows on FIG. 2A indicate a direction of gas flow through the point-of-use (POU) valve and manifold combination 200.

The manifold block 201 may be formed from, for example, stainless steel (e.g., a 316L alloy), aluminum (Al), aluminum oxide ($Al_2O_3$), or a number of other materials known in the art. One or more other types of materials may also be used to form the manifold block 201 provided the one or more materials are compatible with the precursor gases being used in the ALD process. For example, when depositing an aluminum oxide dielectric layer onto a substrate (e.g., using as one of the precursor gases, trimethyl-aluminum (TMA)), the manifold block 201 may be formed from aluminum oxide since the coefficient of thermal expansion (CTE) of the manifold block 201 and the precursor gas is nearly identical. Therefore, if any particles of $Al_2O_3$ are formed within flow paths of the manifold block 201, the particles will not flake off since the CTE of the two materials is substantially the same, thereby preventing an expansion or contraction of one material without also expanding or contracting the other material by substantially the same amount.

The first POU valve 211A and the second POU valve 211B are known in the industry but may be, for example, a Fujikin® online controller valve (available from Fujikin® of America, Fremont, California, USA). Other valves are known to a skilled artisan.

In a specific exemplary embodiment, the first POU valve 211A and the second POU valve 211B are four-way valves, each having two input connections and two output connections. In this embodiment, the two input connections of the four-way valve may be coupled to, for example, a precursor gas ampule (described above with reference to FIG. 1) and an ultra-pure purge-gas supply (e.g., argon, Ar, or nitrogen, $N_2$). For example, the first connector 203A may be coupled to one of the two input connections to the four-way valve. The two output connections of the four-way valve are coupled to, for example, to respective ones of the outlet-flow paths 207 (delivering the precursor gas to the showerhead and/or processing chamber) or to a second valve (not shown in FIG. 2A but described with reference to FIG. 2B, below). The second valve is a divert valve used to redirect the precursor gas to a flow path (not shown) directed away from (outside of) the processing chamber.

The first connector 203A and the second connector 203B may be various types of connector known in the industry to a skilled artisan that may be used to connect the POU valve and manifold combination 200 to precursor gas supplies (not shown). For example, the first connector 203A and the second connector 203B may be a Swagelok® tube fitting (available from Swagelok Company, Solon, Ohio, USA), a Parker Hannifin tube fitting (available from Parker Hannifin Corporation, Fluid System Connectors Division Otsego, Michigan, USA), or other types of connectors known to the person of ordinary skill in the art.

The precursor gases delivered through the first outlet flow path 207 (left side) and the second outlet flow path 207 (right side) exit through a left-side exit port 217A and a right-side exit port 217B. The left-side exit port 217A and the right-side exit port 217B are positioned within a specialized flange, commonly known in the semiconductor industry as a Klein Flansche (KF) vacuum-flange outlet 209 (also known as a Quick Flange (QF)). The KF designation is recognized internationally by ISO, DIN, and other standards-setting organizations. The KF vacuum-flange outlet 209 frequently connects to a ceramic tee (not shown but known in the industry), which in turn connects the KF vacuum-flange outlet 209, on a first side of the ceramic tee, to the showerhead 103 (see FIG. 1), on a second side of the ceramic tee. As is known to the skilled artisan, the ceramic tee may also be connected to a purge-gas line on the third side of the ceramic tee to purge the showerhead 103.

In some embodiments, the KF vacuum-flange outlet 209 may be permanently attached to the manifold block 201. In other embodiments, the KF vacuum-flange outlet 209 may be separately attached to the manifold block 201 as a replaceable component attached by, for example, a threaded connection or bolted connections from the KF vacuum-flange outlet 209 to the manifold block 201. An inner portion of the KF vacuum-flange outlet 209 and peripheral to the left-side exit port 217A and the right-side exit port 217B, form an annulus 210 (shown and described in more detail with regard to FIG. 2C, below).

The point-of-use (POU) valve and manifold combination 200 includes a purge-connection inlet 213 to be coupled to and receive a purge gas (e.g., Ar or $N_2$) from a high-purity purge-gas supply (not shown). The purge gas exits through a purge-gas outlet port 215 (only one port is visible, but the skilled artisan will recognize that multiple outlet ports may be used). The purge-gas outlet port 215 is used to purge the annulus 210. As shown and described in more detail below with reference to FIG. 2C, the purge-gas outlet port 215 is directed substantially toward interior walls of the annulus 210 to more efficiently purge the annulus 210. The annulus 210 is the first portion external to the point-of-use (POU) valve and manifold combination 200 where the precursor gases may combine. The purge-gas outlet port 215 helps to reduce or eliminate any possible mixing, and a subsequent deposition, of the precursor gases that may occur once the precursor gases exit through the left-side exit port 217A and the right-side exit port 217B. The purge-gas outlet port 215 thus reduces or eliminates the chances of deposited layers flaking, thereby otherwise possibly necessitating replacement of the point-of-use (POU) valve and manifold combination 200.

Figure 2B:
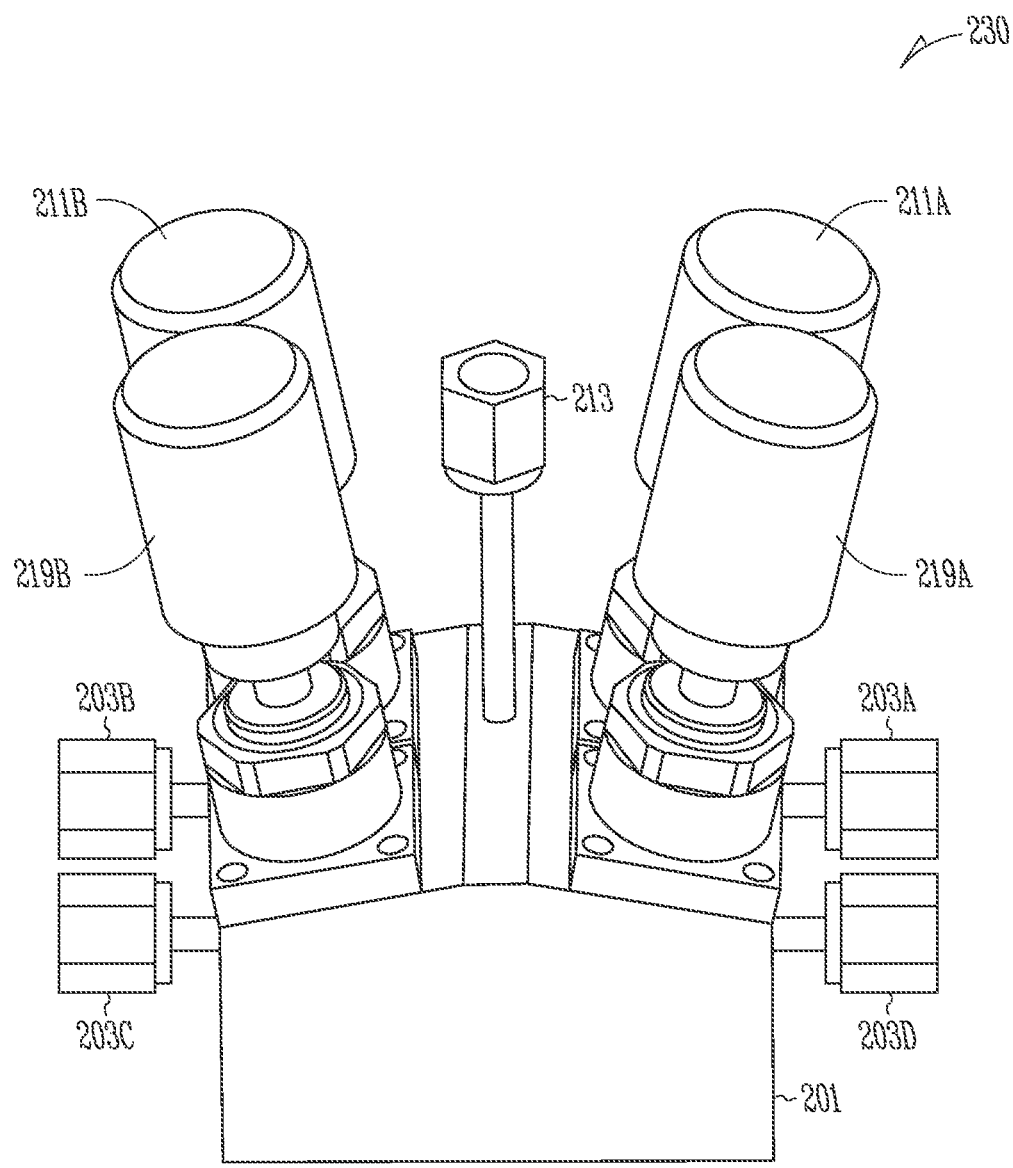
FIG. 2B shows a three-dimensional (3D) representation of an example of the point-of-use (POU) valve and manifold combination of FIG. 2A, as shown from the opposite side of FIG. 2A.

With reference now to FIG. 2B, a three-dimensional (3D) representation 230 of an example of the point-of-use (POU) valve and manifold combination 200 of FIG. 2A, is shown from the opposite side of FIG. 2A. The 3D representation 230 includes a first divert-valve 219A and a second divert-valve 219B. The first divert-valve 219A is coupled internally (e.g., within the manifold block 201) to a first divert connection-port 203D. The second divert-valve 219B is coupled internally (e.g., within the manifold block 201) to a second divert connection-port 203C.

In a specific exemplary embodiment, the first divert-valve 219A and the second divert-valve 219B may any of a variety of two-way valves as known in the art and described above with reference to FIG. 2A. The first divert connection-port 203D and the second divert connection-port 203C may include any of a variety of connectors known in the art, such as the Swagelok® or the Parker-Hannifin connectors described above with reference to FIG. 2A.

The first divert connection-port 203D and the second divert connection-port 203C may be coupled to, for example, a facility vacuum (abatement) or pump to redirect the precursor gases away from the processing chamber. For example, during an operation of an ALD process chamber, the first POU valve 211A and the second POU valve 211B are generally set to a divert position, until the precursor gases are needed in the process chamber. The divert position couples the precursor gases from the first POU valve 211A and the second POU valve 211B to the first divert-valve 219A and the second divert-valve 219B, respectively, to evacuate the precursor gases to the pump or the facility vacuum, until the precursor gases are needed, sequentially during the ALD operation, in the process chamber. Thus, as is known to the skilled artisan, precursor gases should always be flowing due to the critical timing (e.g., fractional seconds as low as nanoseconds) required for flowing the precursor gases into the process chamber. Since precursor gas ampules (see, e.g., the gas source 111 of FIG. 1) are often located a distance from the process chamber (e.g., three meters or more), merely opening and closing the first POU valve 211A and the second POU valve 211B would not provide a sufficiently fast operational time to provide the precursor gases into the process chamber.

Figure 2C:
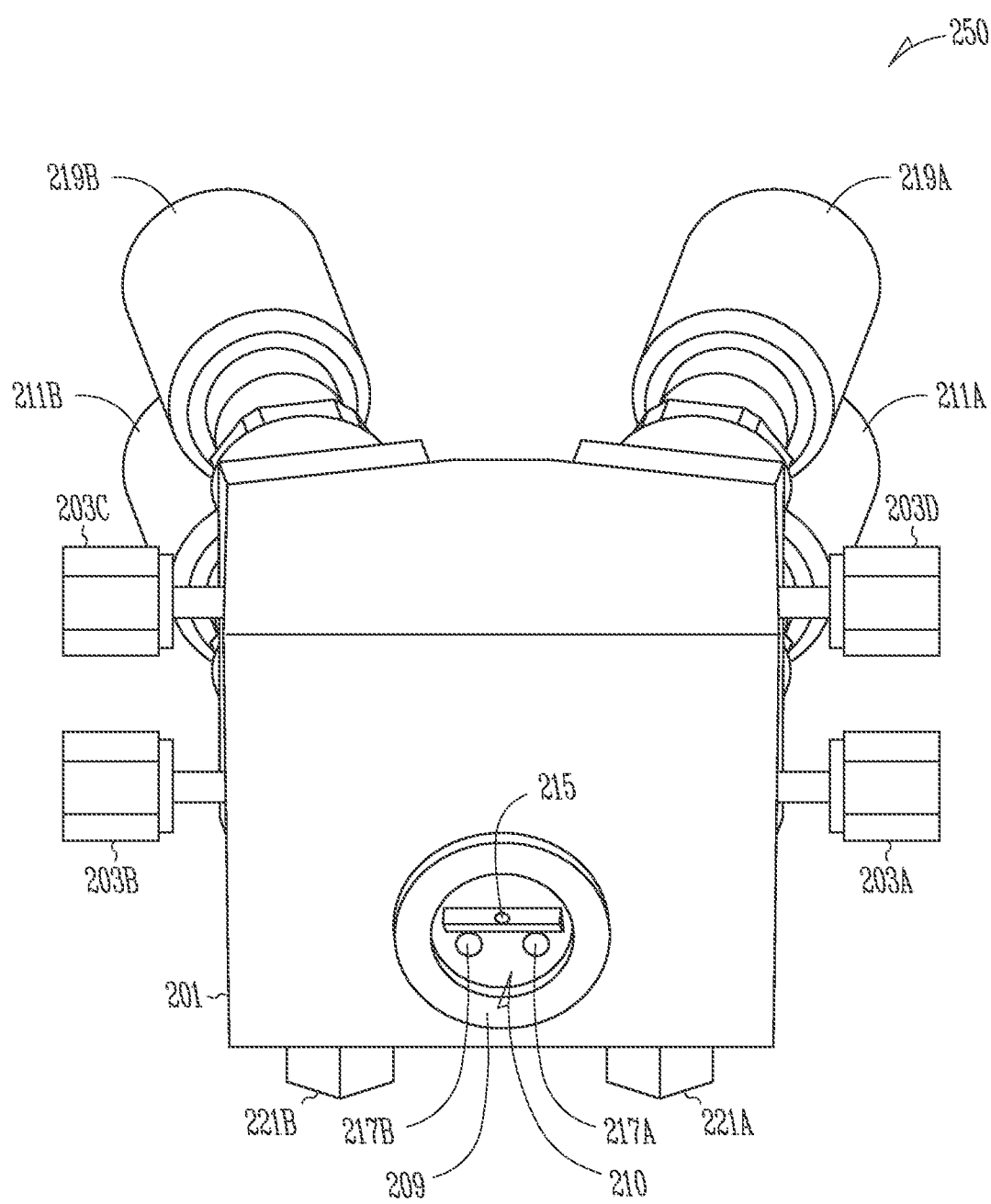
FIG. 2C shows a three-dimensional (3D) representation of an example of the point-of-use (POU) valve and manifold combination of FIG. 2A and FIG. 2B, as shown from a bottom view of FIG. 2B.

FIG. 2C shows a three-dimensional (3D) representation 250 of an example of the point-of-use (POU) valve and manifold combination of FIG. 2A and FIG. 2B, as shown from a bottom view of FIG. 2B. The 3D representation 250 of FIG. 2C indicates a more detailed view of the KF vacuum-flange outlet 209, the annulus 210, and the left-side exit port 217A and the right-side exit port 217B. The 3D representation 250 indicates how the purge-gas outlet port 215 is used to purge the annulus 210 by supplying a purge gas from the purge-connection inlet 213 (see FIGS. 2A and 2B) to reduce or eliminate any precursor gases from the annulus 210 that were supplied from the left-side exit port 217A and the right-side exit port 217B.

Overall, the disclosed subject matter has a number of advantages over contemporaneous off-the-shelf POU valves and manifolds used for delivery of precursor gases into a process chamber. As described herein, the disclosed subject matter uses one or more separate valves and separate flow paths for each of the precursor gases, thereby reducing or eliminating deposits (formed from the precursor gases mixing) at an internal body of the valve or manifold.

Therefore, the disclosed subject matter described above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other POU-valve manifold embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A point-of-use (POU)-valve manifold to control admission of a plurality of gases into a tool, the POU-valve manifold comprising:
   a manifold body configured to couple to a chamber of the tool; and
   for each of the plurality of gases, the POU-valve manifold further includes:
   a gas valve coupled to the manifold body and configured to be coupled to a gas supply, the gas valve having a separate gas flow path internal to and separated from remaining ones of the gas flow paths within the manifold body with the gases only able to meet at a common outlet of the POU-valve manifold to prevent any of the plurality of gases to be mixed within flow paths of the POU-valve manifold; and
   an annulus to at least partially surround the common outlet of the POU-valve manifold.

2. The POU-valve manifold of claim 1, further comprising a purge-gas outlet port coupled to the manifold body, the purge-gas outlet port being directed substantially toward the common outlet of the POU-valve manifold.

3. The POU-valve manifold of claim 2, further comprising:
   a purge-connection inlet coupled to the manifold body, the purge-connection inlet being configured to be coupled to a high-purity purge-gas supply; and
   a separate purge-gas flow path internal to the manifold body coupled between the purge-connection inlet and the purge-gas outlet port.

4. The POU-valve manifold of claim 1, wherein each of the gas valves is coupled to their respective gas flow paths so as not to have any dead-space volumes within the POU-valve manifold.

5. The POU-valve manifold of claim 1, further comprising one or more on-board heating elements coupled to the manifold body.

6. The POU-valve manifold of claim 1, further comprising a divert valve coupled to each gas valve for each of the plurality of gases, the divert valve to divert respective ones of each of the plurality of gases during a period when the gas is not to be directed into the chamber by the gas valve, the divert valves each being coupled to separate divert connection ports to direct the gases outside of the tool.

7. The POU-valve manifold of claim 1, wherein each gas valve and a coupled gas valve comprise two-way valves.

8. A point-of-use (POU)-valve manifold, the POU-valve manifold comprising:
   a manifold body configured to couple to a processing chamber of a processing tool, the manifold body having a separate gas outlet port for each of a plurality of gas inlets;
   a plurality of gas valves coupled upstream to respective ones of the plurality of gas inlets, each of the plurality of gas valves configured to be coupled separately to one of a plurality of gas supplies, each of the plurality of gas valves being coupled on a downstream side to a gas flow path that is internal to the manifold body and is separate from other gas flow paths; and
   an annulus to at least partially surround the gas outlet ports.

9. The POU-valve manifold of claim 8, further comprising a purge-gas outlet port coupled to the manifold body that is directed substantially toward the gas outlet port for each of a plurality of gas inlets.

10. The POU-valve manifold of claim 8, further comprising a plurality of divert valves, each of the plurality of divert valves being coupled separately to one of the plurality of gas valves to divert the precursor gas during a period when the precursor gas is not to be directed into the processing chamber by the gas valve.

11. The POU-valve manifold of claim 8, further comprising a vacuum flange coupled to the annulus.

12. The POU-valve manifold of claim 11, wherein each of the plurality of gas valves is a four-way valve having two input connections and two output connections, wherein the two input connections are configured to be coupled, respectively, to one of the plurality of gas supplies and a purge-gas supply.

13. A point-of-use (POU)-valve manifold to control gases, the POU-valve manifold comprising:
 a plurality of gas inlets and a corresponding number of gas outlets with each corresponding pair of the gas inlets and the gas outlets being coupled to a gas flow path within the POU-valve manifold that is separate from other gas flow paths, each of the plurality of gas inlets coupled to the POU-valve manifold to be controlled separately by at least one gas valve; and
 a common outlet for the gas outlets, the gases flowing within the gas flow paths being configured to meet only at the common outlet of the POU-valve manifold to eliminate the possibility for any gases to be mixed within flow paths within the POU-valve manifold; and
 an annulus to at least partially surround the common outlet for the gas outlets.

14. The POU-valve manifold of claim 13, further comprising a plurality of divert valves, each of the plurality of divert valves being coupled separately to one of the plurality of gas valves to divert a gas during a period of time when a respective one of each of a plurality of gases is not to be directed into a processing chamber by the at least one gas valve for the gas inlet.

15. The POU-valve manifold of claim 13, further comprising independent switching of each of a plurality of gases between divert paths and flow paths to a processing chamber.

16. The POU-valve manifold of claim 13, further comprising a purge-gas inlet and a purge-gas outlet with a purge-gas flow path coupled between the purge-gas inlet and the purge-gas outlet, the purge-gas flow path being separate from any of the gas flow paths, the purge-gas outlet being proximate to the common outlet.

\* \* \* \* \*